(12) United States Patent
McGlaughlin et al.

(10) Patent No.: US 10,839,862 B2
(45) Date of Patent: Nov. 17, 2020

(54) CROSS POINT ARRAY MEMORY IN A NON-VOLATILE DUAL IN-LINE MEMORY MODULE

(71) Applicant: Micron Technology, Inc., Boise, ID (US)

(72) Inventors: Edward McGlaughlin, Minneapolis, MN (US); Ying Yu Tai, Mountain View, CA (US); Samir Mittal, Palo Alto, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/226,626

(22) Filed: Dec. 19, 2018

(65) Prior Publication Data

US 2019/0333548 A1    Oct. 31, 2019

Related U.S. Application Data

(60) Provisional application No. 62/662,688, filed on Apr. 25, 2018.

(51) Int. Cl.
*G11C 13/00* (2006.01)
*G11C 5/14* (2006.01)
(Continued)

(52) U.S. Cl.
CPC ............ *G11C 5/14* (2013.01); *G06F 3/0608* (2013.01); *G06F 3/0679* (2013.01);
(Continued)

(58) Field of Classification Search
CPC ..... G11C 5/14; G11C 13/003; G11C 11/4074; G11C 13/004; G11C 13/0069;
(Continued)

(56) References Cited

U.S. PATENT DOCUMENTS 9,921,898 B1 * 3/2018 Miller .................. G11C 16/225
2010/0008175 A1 * 1/2010 Sweere ............... G06F 12/0866
365/229

(Continued)

FOREIGN PATENT DOCUMENTS

WO    2017188978 A1    11/2017

OTHER PUBLICATIONS

PCT International Search Report and Written Opinion for International Application No. PCT/US2019/028795 dated Aug. 29, 2019, 12 pages.

*Primary Examiner* — Khamdan N. Alrobaie
(74) *Attorney, Agent, or Firm* — Lowenstein Sandler LLP

(57) ABSTRACT

An indication of a power loss can be received at a cross point array memory dual in-line memory module (DIMM) operation component of a memory sub-system. The cross point array memory DIMM operation component includes a volatile memory component and a non-volatile cross point array memory component. In response to receiving the indication of the power loss, a type of write operation for the non-volatile cross point array memory component of the cross point array memory DIMM operation component is determined based on a characteristic of the memory sub-system. Data stored at the volatile memory component of the cross point array memory DIMM operation component is retrieved and written to the non-volatile cross point array memory component of the cross point array memory DIMM operation component by using the determined type of write operation.

20 Claims, 7 Drawing Sheets

(51) Int. Cl.
    *G11C 11/4074*    (2006.01)
    *G06F 3/06*    (2006.01)

(52) U.S. Cl.
    CPC ........ *G11C 11/4074* (2013.01); *G11C 13/003* (2013.01); *G11C 13/004* (2013.01); *G11C 13/0069* (2013.01)

(58) Field of Classification Search
    CPC ............ G11C 2213/77; G11C 11/4072; G11C 11/005; G11C 5/04; G06F 3/0608; G06F 3/0679; G06F 13/16
    See application file for complete search history.

(56)    References Cited

U.S. PATENT DOCUMENTS

2011/0283070 A1*  11/2011  Rischar ................ G05B 19/042
                                                            711/162
    2016/0154597 A1    6/2016  McKelvie et al.
    2016/0378623 A1   12/2016  Kumar et al.
    2017/0060706 A1    3/2017  Kinoshita
    2017/0235675 A1    8/2017  McKelvie et al.
    2018/0330793 A1*  11/2018  Tang ...................... G11C 16/12

* cited by examiner

CROSS POINT ARRAY MEMORY IN A NON-VOLATILE DUAL IN-LINE MEMORY MODULE

RELATED APPLICATION

This application claims the benefit under 35 U.S.C. § 119 of U.S. Provisional Application 62/662,688 filed on Apr. 25, 2018.

TECHNICAL FIELD

The present disclosure generally relates to memory sub-systems, and more specifically, relates to a cross point array memory in a non-volatile dual in-line memory module (DIMM).

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
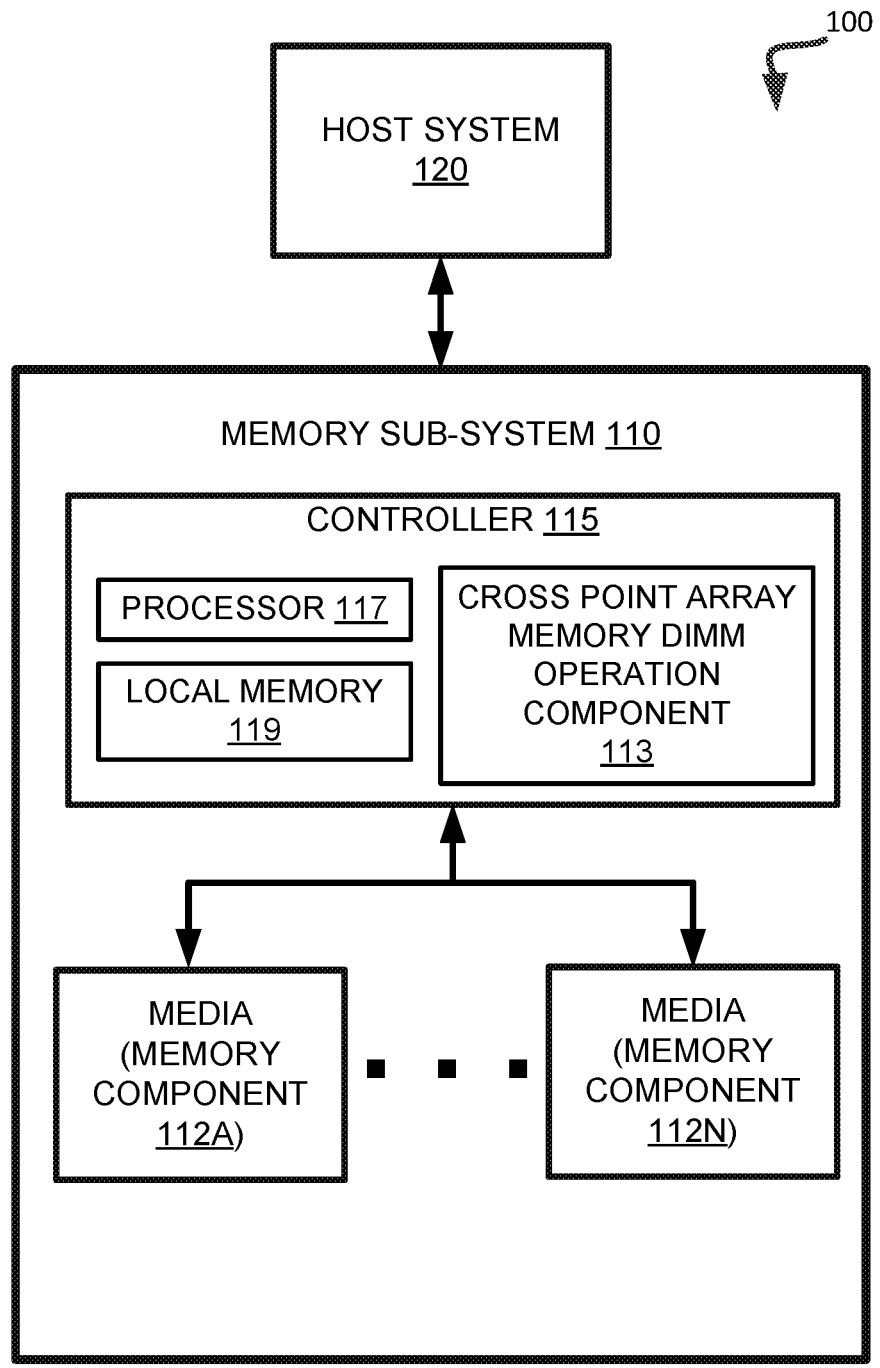
FIG. 1 illustrates an example computing environment that includes a memory sub-system in accordance with some embodiments of the present disclosure.

Aspects of the present disclosure are directed to a memory sub-system that includes a cross point array memory in a non-volatile dual in-line memory module (DIMM). A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system. For example, the host system can utilize the DIMM of the memory sub-system as a cache memory.

A conventional DIMM can include static dynamic random access memory (SDRAM) that is used to store the data that is accessed by the host system. The SDRAM can be a volatile memory. As a result, when the conventional DIMM suffers a loss of power or a condition that results in a loss of power for an amount of time (e.g., during a restart), then the data stored at the SDRAM can be lost. Accordingly, the conventional DIMM can include a flash memory to store data at the SDRAM in the event of a power loss. When the DIMM loses power, the data at the SDRAM can be stored at the flash memory. For example, write operations can be performed to write the data at the SDRAM to the flash memory. Since the flash memory is a non-volatile memory, then the data can remain stored at the flash memory when the loss of power is experienced by the DIMM. Subsequently, when the power is returned to the DIMM, the data stored at the flash memory can be written back to the SDRAM for use by the host system.

The use of a flash memory to store the data from the SDRAM of the DIMM in the event of a power loss can take a prolonged amount of time to write the data to the flash memory to copy the data from the SDRAM because of inherent drawbacks of the flash memory. As a result, when the loss of power is experienced, there may not be enough time to save data stored at the SDRAM to the flash memory. Similarly, when power is restored to the DIMM, there can be an additional downtime for the host system while data is being restored to the SDRAM from the flash memory. Additionally, the performance of a write operation and a read operation for the flash memory can utilize a larger amount of energy or power to read or write data from the flash memory. Therefore, a larger backup power source needs to be used with the conventional DIMM that includes flash memory as the non-volatile memory. Furthermore, the flash memory can have a more limited endurance. For example, a particular number of write operations and/or read operations can be performed at the flash memory before data stored at the flash memory can no longer be reliably stored at the flash memory. Thus, the life of a DIMM that includes a flash memory can also be limited by the endurance of the flash memory.

Aspects of the present disclosure address the above and other deficiencies by using a cross point array memory in a DIMM. In some embodiments, the cross point array memory can perform bit storage based on a change of bulk resistance, in conjunction with a stackable cross-gridded data access array. For example, a bit of '0' or '1' can be determined based on a resistance value of a particular memory cell of the cross point array memory. The cross point array memory can be a non-volatile memory included in the DIMM that is used to store data from the SDRAM of the DIMM in the event of a loss of power. For example, the host system can provide signals to the DIMM that includes the cross point array memory. The host system can transmit a save command to the DIMM when an indication of a power loss is received or is expected. In response, the DIMM can perform a save operation to retrieve data from the SDRAM and store the data at the cross point array memory. Furthermore, when the power is returned to the DIMM, a restore operation can be performed to retrieve the data from the cross point array memory and store the data at the SDRAM of the DIMM. After the data is restored to the SDRAM, the DIMM can prepare the cross point array memory for the next save operation by resetting data values at locations that previously stored the data.

Advantages of the present disclosure include, but are not limited to, a reduction in the amount of time to store data from the SDRAM to the cross point array memory and an amount of time to restore the data from the cross point array memory to the SDRAM. As such, a host system that is associated with the DIMM having a cross point array memory can operate on data stored at the DIMM in less time when power is returned to the DIMM. Additionally, since the performance of read operations and write operations on cross point array memory can utilize less energy, a smaller backup energy or power source can be used with or in the DIMM. Furthermore, the cross point array memory can have a higher endurance and can thus store data from more write operations without the data becoming unreliable. As such, a DIMM that uses the cross point array memory can have a longer lifespan or time in use.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a cross point array memory DIMM operation component 113 (e.g., integrated circuitry with SDRAM and a cross point array memory). In some embodiments, the controller 115 includes at least a portion of the cross point array memory DIMM operation component 113. For example, the controller 115 can include a processor 117 (processing device) configured to execute instructions stored in local memory 119 for performing the operations described herein.

The memory sub-system 110 receives power from a main power source. Additionally, the memory sub-system 110 includes or is connected to a backup power source in case of a power failure at the main power source. In response to the power failure, the cross point array memory DIMM operation component 113 of the memory sub-system 110 can receive an indication of a power loss resulted from the main power source. In response, the cross point array memory DIMM operation component 113 can save data. On the other hand, in response to detecting power recovery of the main power source, the cross point array memory DIMM operation component 113 can restore the saved data in response to power recovery. The cross point array memory DIMM operation component 113 can also pre-save data while normal power is supplied from the main power source in order to shorten the time required to save the data in case of the power failure. Further details with regards to the operations of the cross point array memory DIMM operation component 113 are described below.

Figure 2A:
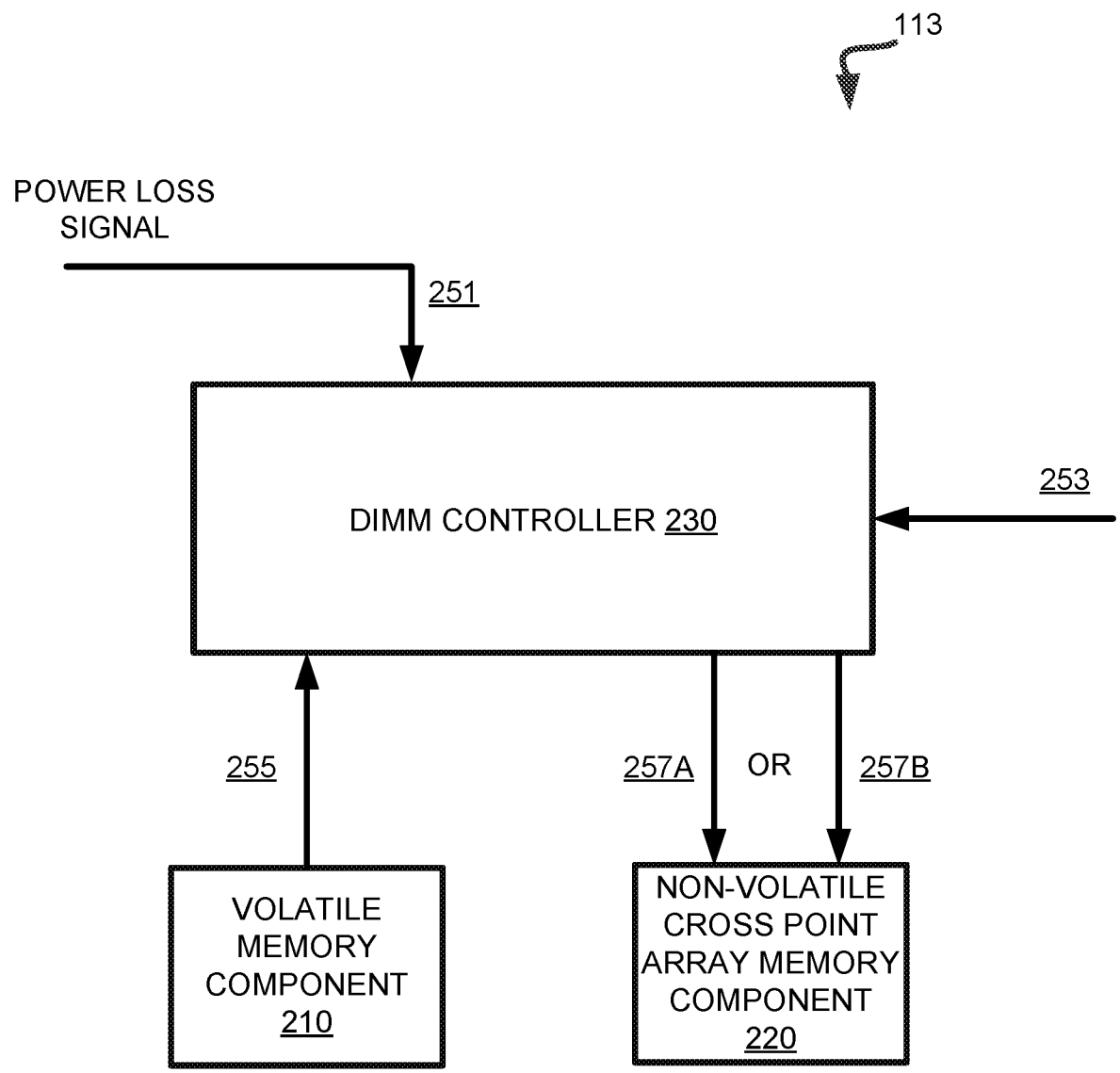
FIG. 2A illustrates example architecture of a dual in-line memory module (DIMM) with a cross point array memory in accordance with some embodiments of the present disclosure.

FIG. 2A is an example system architecture of the cross point array memory DIMM operation component 113 for a save operation in accordance with some embodiments of the present disclosure. As shown, the DIMM controller 230 can include a host system channel 251 that provides signals to the cross point array memory DIMM operation component 113. The DIMM controller 230 can be connected to a volatile memory component 210 (e.g., an SDRAM), a non-volatile cross point array memory component 220. The volatile memory component 210 stores data used or accessed by the host system 120. The non-volatile cross point array memory component 220 stores data from the volatile memory component 210 that can be lost, for example, due to a power loss. The volatile memory component 210 and the non-volatile cross point array memory component 220 can correspond to the media 112A to 112N in FIG. 1.

The DIMM controller 230 monitors input signals from the host system channel 251. If the cross DIMM controller 230 detects a power loss signal or a save command, then a save operation can be performed by transferring data from the volatile memory component 210 to the non-volatile cross point array memory component 220. For example, the DIMM controller 230 can read data stored at the volatile memory component 210 via a volatile memory channel 255. The DIMM controller 230 can determine to save the data to the non-volatile cross point array memory using either a pre-scan write operation or a force write operation through communication via a non-volatile memory channel 257A/257B. Details about the pre-scan write operation and the force write operation are described below with respect to operation 330 of FIG. 3.

The DIMM controller 230 can retrieve a characteristic of the memory sub-system 110 using a non-volatile memory channel 253 in order to determine which write operation to use for the save operation. For example, the DIMM controller 230 can access, via the non-volatile memory channel 253, a power source controller or a backup power source to obtain an energy level of the backup power source. The backup power source can be connected to the memory sub-system 110 and supply a backup power to the memory sub-system 110 during the save operation to be performed by the cross point array memory DIMM operation component 113, but not during a normal operation or other operations that are performed as the host system 120 utilizes data stored at the volatile memory component 210. For the normal operation, a main power source can provide power to the memory sub-system 110. The DIMM controller 230 can also access, via the non-volatile memory channel 253, a data store or the volatile memory component 210 that has metadata of data stored at the volatile memory component 210. The metadata can include information about the data of the volatile memory component 210, such as an amount of data stored at the volatile memory component 210 or a classification of the data (e.g., a type of priority) among other information of the data stored at the volatile memory component 210. The DIMM controller 230 can then determine which write operation to perform based on the characteristic of the memory sub-system 110 collected via the non-volatile memory channel 253.

In some embodiments, the DIMM controller 230 can perform a pre-save operation for faster performance of the save operation. For example, the DIMM controller 230 can start transferring some of the data stored at the volatile memory component 210 to the non-volatile cross point array memory component 220 while the main power source properly operates. More details regarding the pre-save operation are described with respect to FIG. 5.

Figure 2B:
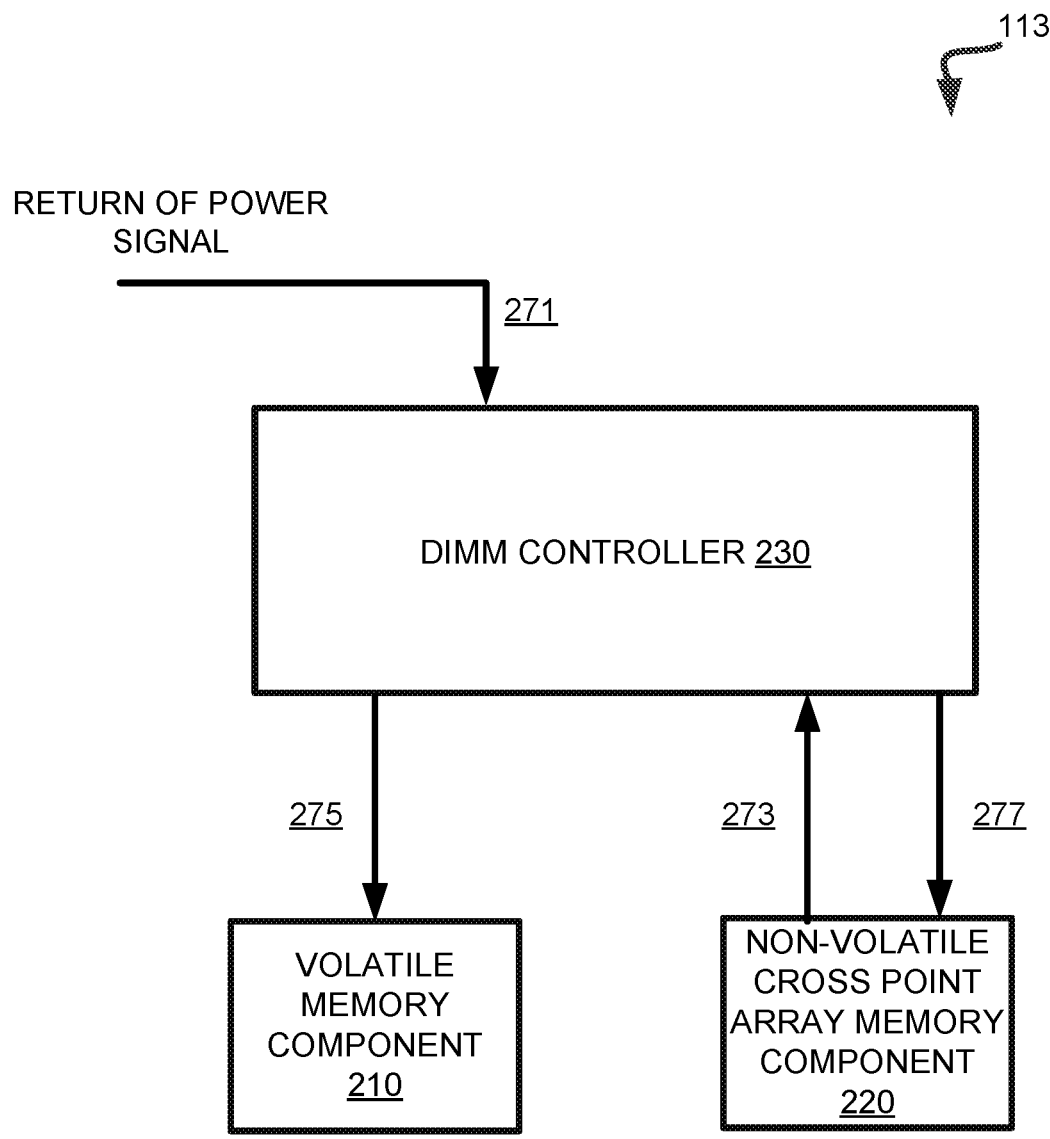
FIG. 2B illustrates example architecture of the DIMM with a cross point array memory in accordance with some other embodiments of the present disclosure.

FIG. 2B is an example of system architecture of the cross point array memory DIMM operation component 113 for a restore operation in accordance with some embodiments of the present disclosure. Similar to the system architecture of FIG. 2A, the cross point array memory DIMM operation component 113 includes the DIMM controller 230 connected to the volatile memory component 210 and the non-volatile cross point array memory component 220. A host system channel 271 of the DIMM controller 230 can provide a return of power signal or a restore command from the host system 120 to the DIMM controller 230. The host system channel 271 can be the same channel as the host system channel 251 of FIG. 2A. In response to detecting the return of power signal, the DIMM controller 230 can perform a restore operation to transfer data from the non-volatile cross point array memory component 220 to the volatile memory component 210. For example, the DIMM controller 230 can read data saved in the non-volatile cross point array memory component 220 via a non-volatile memory channel 273 and write the data to the volatile memory component 210 via a volatile memory channel 275. The volatile memory channel 275 can be the same channel as the volatile memory channel 255 of FIG. 2A. After completing the write operation on the volatile memory component 210, the DIMM controller 230 can reset the non-volatile cross point array memory component 220 via another non-volatile memory channel 277. The non-volatile memory channel 273 and 277 can be the same channel as the non-volatile memory channel 257A and 257B of FIG. 2A. Further details regarding the restore operation are described in conjunction with FIG. 4.

Figure 3:
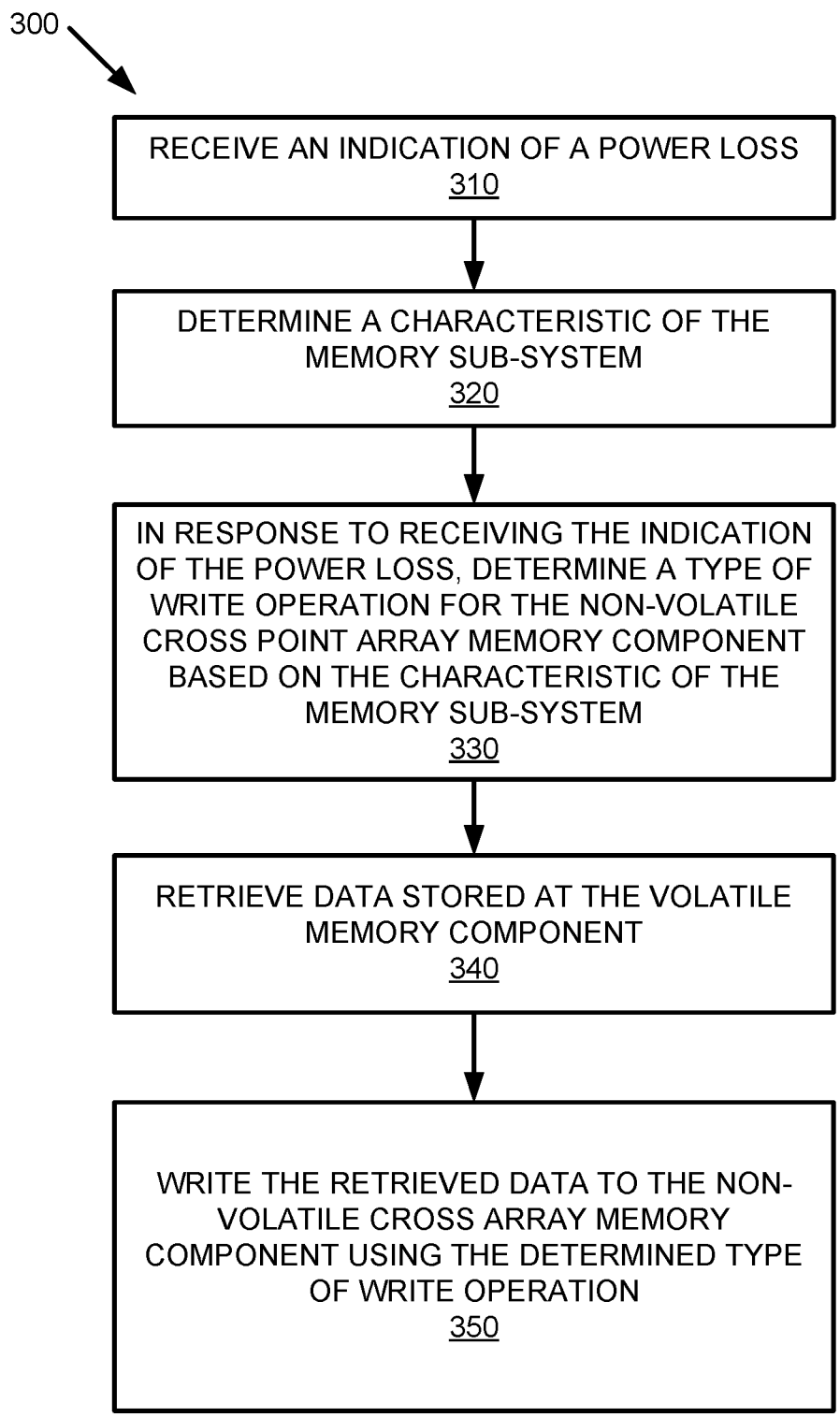
FIG. 3 is a flow diagram of an example method to perform a save operation in accordance with some embodiments of the present disclosure.

FIG. 3 is a flow diagram of an example method 300 to perform a save operation in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the cross point array memory DIMM operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 3, at operation 310, a processing device receives an indication of a power loss. For example, the processing device or the DIMM controller 230 can detect a power loss signal generated from the host system 120 via the host system channel 251 of the cross point array memory DIMM operation component 113. The power loss signal can be at a low signal level (e.g., asserted to a value of '0'). The power loss signal can indicate that the host system 120 intends to power down or can indicate a failure or an expected failure of a main power source that supplies energy to the memory sub-system 110 and/or the host system 120. The processing device can process the power loss signal as a save command from the host system 120 to initiate a save operation so that data stored at the volatile memory component 210 can be written to the non-volatile cross point array memory component 220.

The processing device, at operation 320, determines a characteristic of the memory sub-system 110. For example, the processing device can determine a characteristic of a backup power source that provides a backup power to the memory sub-system 110 for the save operation to be performed by the cross point array memory DIMM operation component 113. The processing device can determine an energy level (i.e., how much energy is remaining) of the backup power source. In another example, the processing device can determine a characteristic of data stored in the volatile memory component 210 that is to be saved in the non-volatile cross point array memory component 220. In particular, the processing device can determine a size of the data stored in the volatile memory component 210 or an amount of the data to be transferred to the non-volatile cross point array memory component 220. Additionally, the processing device can identify a classification of data blocks of the data stored in the volatile memory component 210. Data blocks can be classified into high priority and low priority depending on stored data. For example, high priority data block can include user data (e.g., data generated by a user of the host system 120) or any other data critical to operation of the host system 120 (or more difficult to recover). Low priority data block can have non-user data such as metadata for the user data or any other data less detrimental to the operation of the host system 120 (or easier to recover). The processing device can classify data blocks based on metadata for the data blocks of the volatile memory component 210.

At operation 330, the processing device, in response to receiving the indication of the power loss, determines a type of write operation for the non-volatile cross point array memory component 220 based on the characteristic of the memory sub-system 110. There can be multiple write operations available to be performed on the non-volatile cross point array memory component 220 of the cross point array memory DIMM operation component 113. Examples of such write operations include, but are not limited to, a pre-scan write operation and a force write operation.

A pre-scan write operation can write data to the non-volatile cross point array memory component 220 based on a comparison between data blocks of the data from the volatile memory and data blocks previously stored at the non-volatile cross point array memory component 220. For example, such data blocks can store values that were previously written to the data blocks when prior data was written to the non-volatile cross point array memory component 220. The values that were previously written to the data blocks for the prior data can still be present at the non-volatile cross point array memory component 220 as an erase operation is not performed for the non-volatile cross point array memory component 220. In some embodiments, such data blocks can store the same value (e.g., zero) as they were previously reset as described in detail with respect to operation 430 of FIG. 4. The pre-scan write operation can include a pre-read operation. The pre-read operation can first identify locations (or data blocks) in the non-volatile cross point array memory component 220 to be written and can read data that is currently stored at these locations of the non-volatile cross point array memory component 220. Each data block of the data to be stored (e.g., data from the volatile memory component 210) would have a corresponding data block in the non-volatile cross point array memory component 220. The pre-scan write operation can also include a comparison operation followed by the pre-read operation. For example, if a particular data block at the non-volatile cross point array memory component 220 currently stores data that matches a corresponding data block of the data from the volatile memory component 210, then the processing device can determine not to write the data corresponding to that data block of the data from the volatile memory component 210 to the data block at the non-volatile cross point array memory component 220 as the data currently stored at the non-volatile cross point array memory component 220 matches the particular data block of the volatile memory component 210. Otherwise, if the particular data block at the non-volatile cross point array memory component 220 currently stores data that does not match the corresponding data block of the data that is from the volatile memory component 210, then a write operation can be performed at the particular data block of the non-volatile cross point array memory component 220. For example, a voltage signal can be applied to the particular data block of the non-volatile cross point array memory component 220 to change a value of the data stored at the particular data block. Therefore, in the pre-scan write operation, the processing device writes data to data blocks of the non-volatile cross point array memory component 220 for the data blocks that include a data value that is different from a data value of a corresponding data block from the volatile memory component 210.

On the other hand, a force write operation does not perform the pre-read operation and/or comparison operation. Instead, the force write operation can apply a voltage to every data block of the non-volatile cross point array memory component 220 that is to store data from the volatile memory component 210. For example, the force write operation can apply a voltage to a data block to set a value of '0' and can apply another voltage to another data block to set a value of '1.' Thus, the force write operation can write the entire data of the volatile memory component 210 to the non-volatile cross point array memory component 220. In some embodiments, the pre-scan write operation can be performed in less time and can take less power, On the other hand, the force write operation can take more time and more power. However, the force write operation can be considered to result in more reliable data storage, as each data block is being written to store data regardless of stored data, the respective data block becomes less prone to an error (e.g., an error caused by a drift in voltage threshold for storing data over time). Therefore, the processing device can determine to use the force write operation for better reliability of data when there is sufficient backup power and/or time to complete the save operation.

In some embodiments, the processing device can set as a default to write data from the volatile memory component 210 to the non-volatile cross point array memory component 220 using the pre-scan write operation for the save operation. In another embodiment, the processing device can selectively perform the force write operation instead of the pre-scan write operation in certain instances. For example, if there is more than enough power in the backup power source of the memory sub-system 110 to perform the save operation, the processing device can use the force write operation for better reliability of data. The processing device can determine whether the energy level of the backup power source satisfies an energy level threshold. The energy level threshold can be based on a particular energy level that is sufficient to write the data from the volatile memory component 210 to the non-volatile cross point array memory component 220. The particular energy level can also indicate an energy level of the backup power source that is sufficient for the processing device to perform the force write operation. If an energy level of the backup power source exceeds a particular energy level set as the threshold, the processing device can determine to use the force write operation. Otherwise, the processing device can perform the pre-scan write operation.

As another example, the processing device can determine to use the force write operation when an amount of the data stored in the volatile memory component 210 to be written to the non-volatile cross point array memory component 220 does not exceed a particular size of data. Because the force write operation takes longer than the pre-scan write operation, the processing device can perform the force write operation when the force write operation can be completed for the amount of data stored in the 210. It is assumed that there is sufficient backup energy available for the save operation using the force write operation. Thus, the processing device can apply a data size threshold to control when to write data to the non-volatile cross point array memory component 220 by performing the force write operation.

The processing device can also determine which write operation to use based on a classification of data blocks from the volatile memory component 210. For example, the processing device can store data blocks that are classified as high priority using the force write operation and other data blocks classified as low priority using the pre-scan write operation. The high priority data block can store user data (e.g., data generated by a user of the host system 120) or any other data critical to operation of the host system 120 (or more difficult to recover) and low priority data block can include non-user data such as metadata for the user data or any other data less detrimental to the operation of the host system 120 (or easier to recover).

The processing device can further consider an amount of energy that can be supplied by the backup power source. If there is not sufficient backup power to write some data blocks using the force write operation, the processing device can determine to perform the pre-scan write operation for data blocks classified as low priority while determining to perform the force write operation for data blocks classified as high priority.

At operation 340, the processing device retrieves data stored at the volatile memory component 210. For example, a read operation is performed on the volatile memory component 210. Then, at operation 350, the processing device writes the retrieved data to the non-volatile cross point array memory component 220 by using the determined type of write operation. For example, the pre-scan write operation or the force write operation can be performed as described above with respect to operation 330. The processing device can further keep a record of which data block from the volatile memory component 210 is written to which data block of the non-volatile cross point array memory component 220.

In some embodiments, data can be written to the non-volatile cross point array memory component 220 sequentially when being written from the volatile memory component 210. For example, the save operation can save the data from the volatile memory component 210 in a contiguous or proximate memory cells or data block locations. As such, a disturbance mechanism can be reduced when reading the data from the non-volatile cross point array memory component 220 during a restore operation. For example, the data in the contiguous memory cells can be read in a streaming manner. In the same or alternative embodiments, multiple cursors can be used to write data from the volatile memory component 210 to the non-volatile cross point array memory component 220. For example, the volatile memory component 210 can include multiple channels of data where data can be retrieved from the volatile memory component 210. Each channel can be used to provide data to a particular cursor that writes data to a particular data block location of the cross point array memory.

Figure 4:
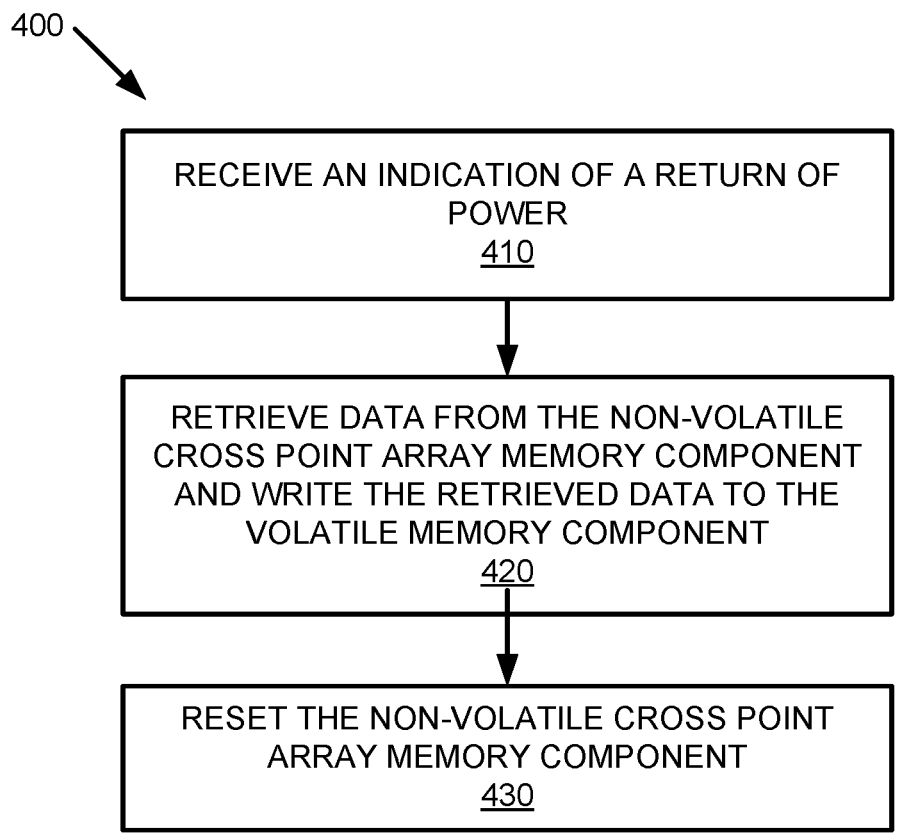
FIG. 4 is a flow diagram of an example method to perform a restore operation in accordance with some embodiments of the present disclosure.

FIG. 4 is a flow diagram of an example method 400 to perform a restore operation in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the cross point array memory DIMM operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, a processing device receives an indication of a return of power. For example, the processing device can detect a return of power signal generated from the host system 120 via the host system channel 271 of the cross point array memory DIMM operation component 113. The return of power signal can be a high signal level (e.g., asserted to a value of '1'). Also, the return of power signal can indicate a return or an expected return of power from the main power source for the memory sub-system 110 and/or the host system 120. The processing device can process the return of power signal as a restore command from the host system 120 to initiate a restore operation on data stored at the non-volatile cross point array memory component 220 to the volatile memory component 210.

In response receiving the indication of the return of power, the processing device, at operation 420, retrieves data from the non-volatile cross point array memory component 220 and writes the data to the volatile memory component 210. At operation 430, the processing device resets the data blocks of the non-volatile cross point array memory component 220 that stored the data written to the volatile memory component 210. For example, the processing device can determine which data blocks in the non-volatile cross point array memory component 220 have been written for the prior save operation. The processing device can refer to a record (as mentioned with respect to operation 350) that maps data blocks of the volatile memory component 210 to data blocks in the non-volatile cross point array memory component 220 in the save operation. The processing device then can write the same data value (for example, data value of '0') to the data blocks of the non-volatile cross point array memory component 220 that stored the data written to the volatile memory component 210. In some embodiments, the processing device can perform force write operation on these data blocks of the non-volatile cross point array memory component 220. The processing device can apply a voltage to these data blocks of the non-volatile cross point array memory component 220 to set a value of '0.' The setting of the value of each of the memory cells to a value of '0' can result in better threshold voltage distribution of the memory cells when subsequent values are stored at the memory cells of the data blocks. In some embodiments, the processing device can use the pre-scan write operation on these data blocks of the non-volatile cross point array memory component 220 in order to reset the data values. The processing device can additionally reset other data blocks of the non-volatile cross point array memory component 220 that have not stored data written to the volatile memory component 210.

After the non-volatile cross point array memory component 220 has been reset, the processing device can receive an indication of a power loss triggering the save operation described with respect to FIG. 3. In response, the processing device can perform the pre-scan write operation as a default to save data stored at the volatile memory component 210 to the non-volatile cross point array memory component 220.

Figure 5:
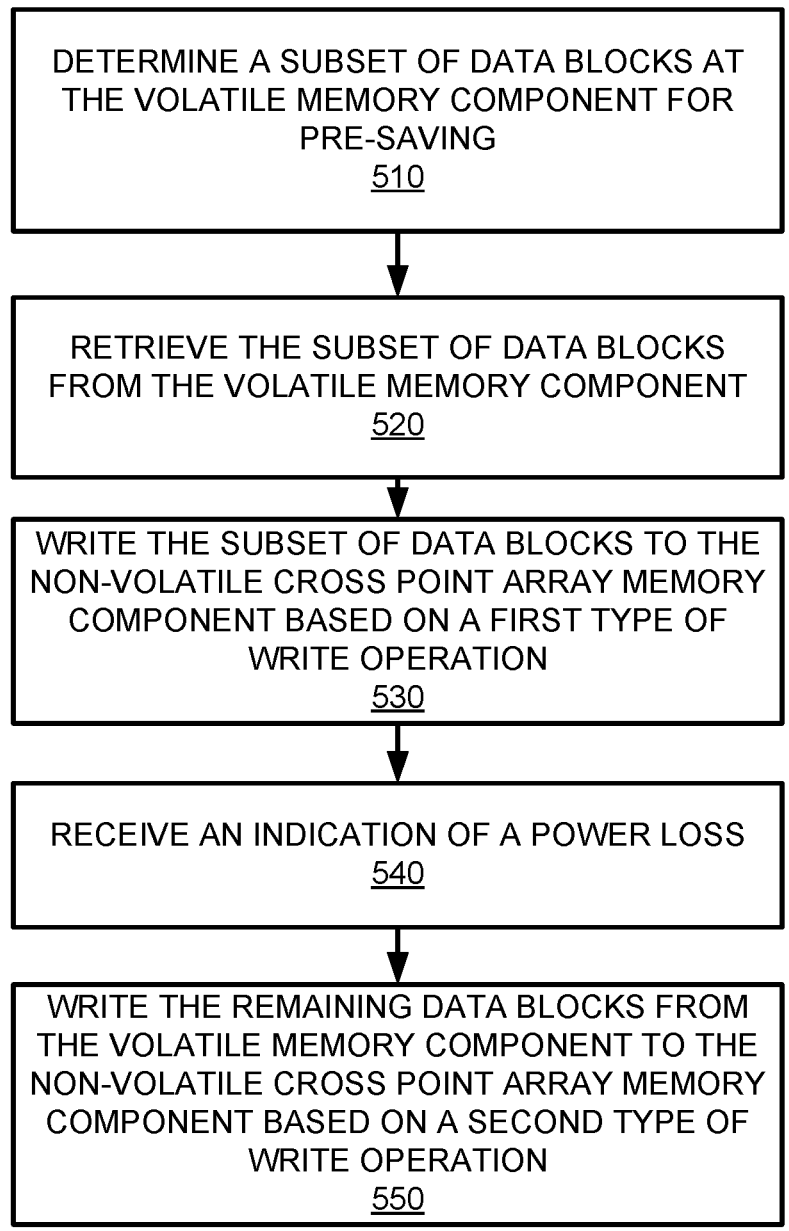
FIG. 5 is a flow diagram of an example method to perform a pre-save operation in accordance with some embodiments of the present disclosure.

FIG. 5 is a flow diagram of an example method 500 to perform a pre-save operation in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the cross point array memory DIMM operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

A pre-save operation can be performed by writing some data stored at the volatile memory component 210 to the non-volatile cross point array memory component 220 during normal operation of the cross point array memory DIMM operation component 113. In this way, the time required for the save operation can be reduced as certain data stored at the volatile memory component 210 can be stored at the non-volatile cross point array memory component 220 before the save operation is performed. The pre-save operation can be performed after the non-volatile cross point array memory component 220 has been reset as described with respect to operation 430.

At operation 510, a processing device determines a subset of data blocks at the volatile memory component 210 for the pre-saving operation. For example, the processing device can start performing the pre-save operation from data blocks that were stored earlier (i.e., older data) in the volatile memory component 210. In another example, the processing device can select data blocks that are least frequently accessed by the host system 120.

The processing device, at operation 520, retrieves the determined subset of data blocks from the volatile memory component 210. The processing device then, at operation 530, writes the subset of data blocks to the non-volatile cross point array memory based on a first type of write operation. For example, the first type of write operation can be performed while a power is supplied to the memory sub-system 110 and/or the host system 120 from the main power source. In some embodiments, the first type of write operation can be the force write operation that is to be performed on the subset of data blocks of the volatile memory component 210 for a better reliability of the subset of data blocks when stored at the non-volatile cross point array memory. In other embodiments, the first type of write operation can be the pre-scan write operation. The processing device can perform the write operation as a background process that does not interfere with operations of the host system 120. The processing device can also keep a record of which data block from the volatile memory component 210 has been transferred the non-volatile cross point array memory component 220.

While some data blocks of the volatile memory component 210 are being stored at the non-volatile cross point array memory component 220, the processing device, at operation 540, receives an indication of a power loss similar to the power loss signal described with respect to operation 310 in FIG. 3. In response, the processing device, at operation 550, saves the remaining data blocks from the volatile memory component 210 to the non-volatile cross point array memory component 220 based on a second type of write operation. The second type of write operation can be different than the first type of write operation. For example, the first type of write operation can be the force write operation and the second type of write operation can be the pre-scan write operation. The processing device can determine the remaining data blocks based on the record kept from the pre-save operation. The remaining data blocks of the volatile memory component 210 are the data blocks that have not yet been written to the non-volatile cross point array memory component 220 during the pre-save operation. In some embodiments, the processing device can perform the save operation at operation 550 as described with respect to FIG. 4.

Figure 6:
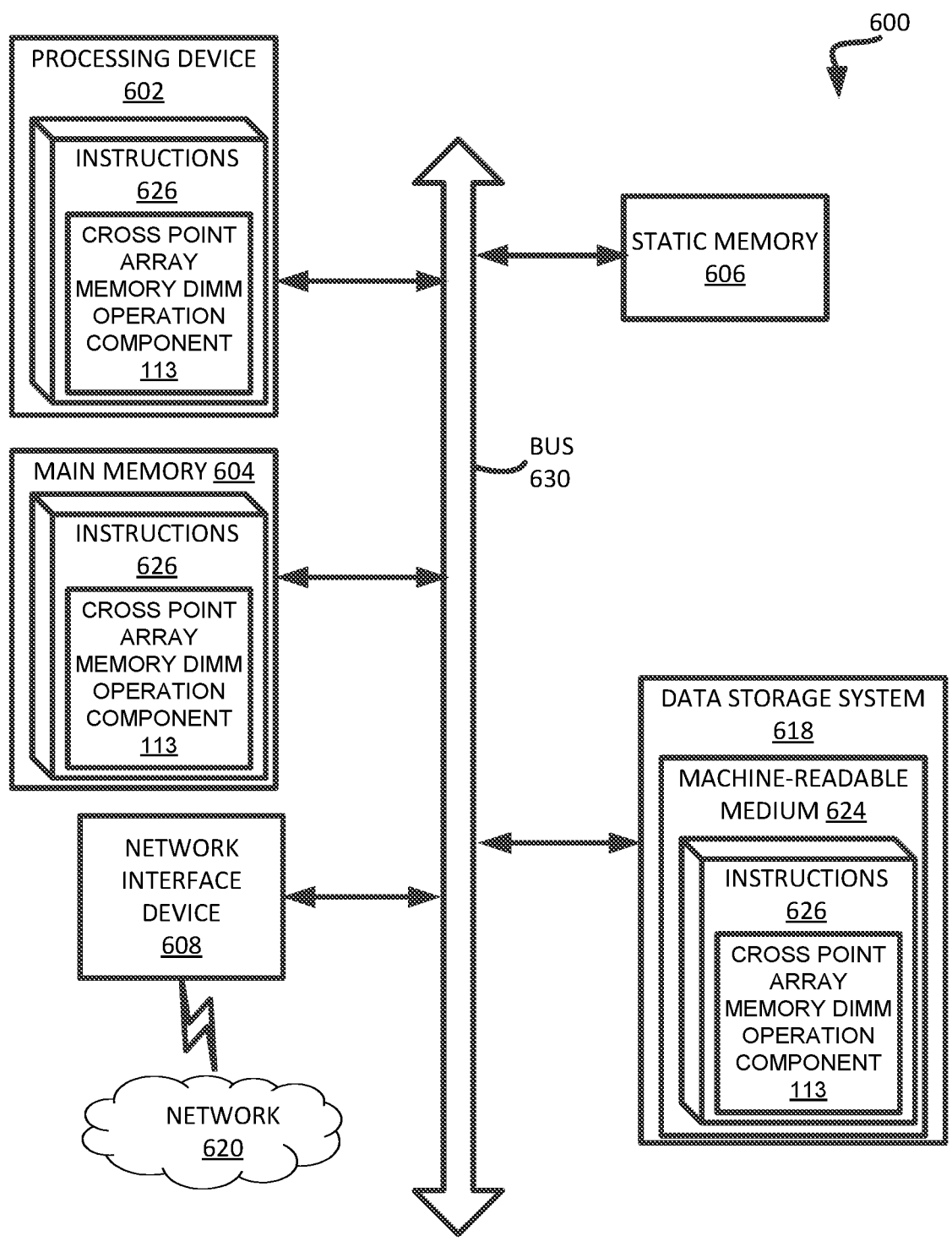
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the cross point array memory DIMM operation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a cross point array DIMM operation component (e.g., the cross point array DIMM operation component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a volatile memory component;
a non-volatile cross point array memory component; and
a processing device, operatively coupled with the volatile memory component and the non-volatile cross point array memory component, to:
receive an indication of a power loss to the system;
determine a characteristic of the system;
in response to receiving the indication of the power loss to the system, determine, based on the characteristic of the system, a type of write operation from a plurality of types of write operations for the non-volatile cross point array memory component;
retrieve data stored at the volatile memory component; and
write the retrieved data to the non-volatile cross point array memory component by using the determined type of write operation.

2. The system of claim 1, wherein the plurality of types of write operations for the non-volatile cross point array memory component comprises:
a pre-scan write operation that writes the retrieved data to the non-volatile cross point array memory component based on a comparison between data blocks of the retrieved data and other data blocks stored at the non-volatile cross point array memory component; and
a force write operation that writes each data block of the retrieved data stored in the volatile memory component to the non-volatile cross point array memory component.

3. The system of claim 1, wherein the characteristic of the system corresponds to an energy level of a backup power source that provides a backup power to the system responsive to the power loss, and wherein the processing device is further to:
determine whether the energy level of the backup power source satisfies an energy level threshold, and wherein determining the type of write operation is based on the determination of whether the energy level of the backup power source satisfies the energy level threshold, and wherein the energy level threshold is based on a particular energy level that is sufficient to write the retrieved data to the non-volatile cross point array memory component.

4. The system of claim 1, wherein the characteristic of the system corresponds to an amount of the data stored in the volatile memory component to be written to the non-volatile cross point array memory component, and wherein the processing device is further to:
determine whether the amount of the data stored in the volatile memory component to be written to the non-volatile cross point array memory component satisfies a data size threshold, wherein determining the type of write operation is based on the determination of whether the amount of the data satisfies the data size threshold, and wherein the data size threshold is based on an energy level of a backup power source for the system being sufficient to write the amount of the data to the non-volatile cross point array memory component.

5. The system of claim 1, wherein the characteristic of the system corresponds to a classification of data blocks of the data, wherein the determined type of write operation for a particular data block of the data is based on a corresponding classification for each particular data block of the data.

6. The system of claim 2, wherein to write data stored in the volatile memory component to the non-volatile cross point array memory component by using the pre-scan write operation, the processing device is further to:
determine one or more data blocks of the non-volatile cross point array memory component where the data stored in the volatile memory component is to be written;
compare data from each data block in the one or more data blocks of the non-volatile cross point array memory component with data from a corresponding data block of the data retrieved from the volatile memory component;
determine a subset of the one or more data blocks of the non-volatile cross point array memory component having data different from data of a corresponding data block of the volatile memory component; and
write, to the subset of the one or more data blocks of the non-volatile cross point array memory component, data of a corresponding data block stored in the volatile memory component.

7. The system of claim 1, wherein the system is a dual in-line memory module (DIMM).

8. A method comprising:
receiving an indication of a power loss to a memory sub-system, the memory sub-system comprising a volatile memory component and a non-volatile cross point array memory component;
determining a characteristic of the memory sub-system;
in response to receiving the indication of the power loss to the memory sub-system, determining, based on the characteristic of the memory sub-system, a type of write operation from a plurality of types of write operations for the non-volatile cross point array memory component;
retrieving data stored at the volatile memory component; and
writing, by a processing device, the retrieved data to the non-volatile cross point array memory component by using the determined type of write operation.

9. The method of claim 8, wherein the plurality of types of write operations for the non-volatile cross point array memory component comprises:
a pre-scan write operation that writes the retrieved data to the non-volatile cross point array memory component based on a comparison between data blocks of the retrieved data and other data blocks stored at the non-volatile cross point array memory component; and
a force write operation that writes each data block of the retrieved data stored in the volatile memory component to the non-volatile cross point array memory component.

10. The method of claim 8, wherein the characteristic of the memory sub-system corresponds to an energy level of a backup power source that provides a backup power to the memory sub-system responsive to the power loss, and wherein the method further comprising:
determining whether the energy level of the backup power source satisfies an energy level threshold; and
wherein determining the type of write operation is based on the determination of whether the energy level of the backup power source satisfies the energy level threshold, wherein the energy level threshold is based on a particular energy level that is sufficient to write the retrieved data to the non-volatile cross point array memory component.

11. The method of claim 8, wherein the characteristic of the memory sub-system corresponds to an amount of the data stored in the volatile memory component to be written to the non-volatile cross point array memory component, and wherein the method further comprising:
determining whether the amount of the data stored in the volatile memory component to be written to the non-volatile cross point array memory component satisfies a data size threshold; and
wherein determining the type of write operation is based on the determination of whether the amount of the data satisfies the data size threshold, wherein the data size threshold is based on an energy level of a backup power source for the memory sub-system being sufficient to write the amount of the data to the non-volatile cross point array memory component.

12. The method of claim 8, wherein the characteristic of the memory sub-system corresponds to a classification of data blocks of the data, wherein the determined type of write operation for a particular data block of the data is based on a corresponding classification for each particular data block of the data.

13. The method of claim 9, wherein writing the data stored in the volatile memory component to the non-volatile cross point array memory component by using the pre-scan write operation comprises:
determining one or more data blocks of the non-volatile cross point array memory component where the data stored in the volatile memory component is to be written;
comparing data from each data block in the one or more data blocks of the non-volatile cross point array memory component with data from a corresponding data block of the data retrieved from the volatile memory component;
determining a subset of the one or more data blocks of the non-volatile cross point array memory component having data different from data of a corresponding data block of the volatile memory component; and
writing, to the subset of the one or more data blocks of the non-volatile cross point array memory component, data of a corresponding data block stored in the volatile memory component.

14. The method of claim 8, wherein the memory sub-system is a dual in-line memory module (DIMM).

15. A system comprising:
a volatile memory component;
a non-volatile cross point array memory component; and
a processing device, operatively coupled with the volatile memory component and the non-volatile cross point array memory component, to:
receive an indication of a return of power to the system;
in response to receiving the indication of the return of power, retrieve data from the non-volatile cross point array memory component and write the data from the non-volatile cross point array memory component to the volatile memory component; and
in response to writing the data from the non-volatile cross point array memory component to the volatile memory component:
identify one or more data blocks of the non-volatile cross point array memory component that stored the data written to the volatile memory component and
write a same data value to the one or more data blocks of the non-volatile cross point array memory component.

16. The system of claim 15, wherein the processing device is further to, in response to writing the data from the non-volatile cross point array memory component to the volatile memory component, write the same data value to another one or more data blocks of the non-volatile cross point array memory component that do not store data written to the volatile memory component.

17. The system of claim 15, wherein the processing device is further to:
receive an indication of a power loss to the system;
in response to receiving the indication of the power loss and writing the same data value to the one or more data blocks of the non-volatile cross point array memory component that stored the data written to the volatile memory component, determine to not write a particular data block of the volatile memory component matching a corresponding data block in the non-volatile cross point array memory component to the non-volatile cross point array memory component; and
determine to write another data block of the volatile memory component not matching a corresponding data block of the non-volatile cross point array memory component to the non-volatile cross point array memory component.

18. The system of claim 15, wherein the processing device is further to:
write one or more data blocks of the volatile memory component to the non-volatile cross point array memory component while the power is supplied to the system; and
in response to receiving an indication of a power loss to the system and writing the same data value to the one or more data blocks of the non-volatile cross point array memory component that stored data written to the volatile memory component:
  determine one or more data blocks of the volatile memory component that have not been written to the non-volatile cross point array memory component,
  determine to not write, to the non-volatile cross point array memory component, a subset of the determined one or more data blocks of the volatile memory component that match a corresponding data block in the non-volatile cross point array memory component, and
  write, to the non-volatile cross point array memory component, another subset of the determined one or more data blocks of the volatile memory component that do not match a corresponding data block in the non-volatile cross point array memory component.

19. The system of claim 15, wherein the same data value corresponds to a zero value.

20. The system of claim 15, wherein the system is a dual in-line memory module (DIMM).

* * * * *